(12) United States Patent
Burnett et al.

(10) Patent No.: US 6,714,436 B1
(45) Date of Patent: Mar. 30, 2004

(54) WRITE OPERATION FOR CAPACITORLESS RAM

(75) Inventors: James D. Burnett, Austin, TX (US); Alexander Hoefler, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/393,053

(22) Filed: Mar. 20, 2003

(51) Int. Cl.$^7$ ............................................. G11C 11/24
(52) U.S. Cl. ..................... 365/149; 365/181; 365/182
(58) Field of Search ............................. 365/149, 182, 365/181, 184

(56) References Cited

U.S. PATENT DOCUMENTS

| | | | |
|---|---|---|---|
| 5,448,513 A | 9/1995 | Hu | |
| 5,798,965 A | 8/1998 | Jun | |
| 6,130,450 A | 10/2000 | Kohyama | |
| 6,238,967 B1 | 5/2001 | Shiho | |
| 6,538,916 B2 * | 3/2003 | Ohsawa | 365/149 |
| 6,560,142 B1 * | 5/2003 | Ando | 365/177 |
| 6,620,679 B1 * | 9/2003 | Tzeng et al. | 438/250 |
| 6,632,723 B2 * | 10/2003 | Watanabe et al. | 438/421 |
| 2002/0051378 A1 | 5/2002 | Ohsawa | |
| 2002/0130341 A1 | 9/2002 | Horiguchi | |

OTHER PUBLICATIONS

Fazan et al., "A Highly Manufacturable Capacitor–Less IT–DRAM Concept," SPIE Conference 2002, 14 pages.
Fazan et al., "A Simple 1–Transistor Capacitor–Less Memory Cell for High Performance Embedded DRAMs," IEEE 2002 Custom Integrated Circuits Conference, pp. 99–102.

"Memory Design Using One–Transistor Gain Cell on SOI," ISSCC 2002/Session 9/DRAM and Ferroelectric Memories/9.1; 8 pages.

Okhonin et al., "A Capacitor–Less 1T–DRAM Cell," IEEE Electronic Device Letters, vol. 23, No. 2, Feb. 2002, pp. 85–87.

Okhonin et al., "A SOI Capacitor–less 1T–DRAM Concept," 2001 IEEE International SOI Conference, pp. 153–154.

Nishiyama et al., "Suppression of the Floating–Body Effect in Partially–Depleted SOI MOSFET's with SiGe Source Structure and Its Mechanism," IEEE Transactions on Electronic Devices, vol. 44, No. 12, Dec. 1997, pp. 2187–2192.

* cited by examiner

Primary Examiner—Michael S. Lebentritt
Assistant Examiner—Hien Nguyen

(57) ABSTRACT

A method for writing data to single-transistor capacitorless (1T/0C) RAM cell, wherein the cell structure is predicated on an SOI MOS transistor that has a floating body region (12). Data is written to the cell by the instigation of band-to-band tunneling (BTBT) and the resulting generation of hole/electron pairs. Electrons are drawn from the body region through forward-biased drain (14) and source (15) regions so that holes accumulate in the body region. The increase in threshold voltage, caused by the accumulation of holes, may be defined and detected as a logic level (ONE, for example). In one embodiment, a split biasing scheme applies substantially identical voltages to the drain and to the source and a negative bias to the gate. In alternative embodiments, a negative gate bias is not required and the drain and source bias voltages may be offset so as to mitigate source damage.

30 Claims, 3 Drawing Sheets

WRITE OPERATION FOR CAPACITORLESS RAM

BACKGROUND OF THE INVENTION

1. Field of the Invention

The subject invention relates generally to the design and operation of semiconductor devices and, more particularly, to the design and operation of a single-transistor capacitorless (1T/0C) random access memory (RAM) cell, wherein data is written to the cell through utilization of a band-to-band tunneling (BTBT) mechanism in a manner that modulates the threshold voltage of the cell.

2. Related Art

A number of RAM designs based on CMOS technology are prominent in the art. (See, for example, Neil H.E. Weste and Kamran Eshraghian, *Principles of CMOS VLSI Design:* Addison-Wesley, 1994, pp. 563–585). Perhaps the most commonly used CMOS RAM configuration is predicated on a six-transistor cross-coupled inverter. However, more recently, single-transistor MOS RAMs have appeared that store data on a capacitor connected to a pass transistor. In general, sense amplifiers operate to detect a small voltage differential that arises when a selected cell is switched onto a bit line.

A variety of approaches have been adopted to implement the data-storage capacitor in a single-transistor MOS RAM. For example, the capacitor may be implemented simply as a second transistor. Alternatively, an appreciable reduction in semiconductor real estate that is occupied by the RAM cell may be realized by the adoption of a trench capacitor structure or a stacked capacitor structure. Nevertheless, there remains a persistent requirement to reduce the area occupied by a RAM cell beyond that which appears feasible through a transistor/capacitor configuration. The 1T/0C memory cell is a response to this demand, and numerous ramifications of the 1T/0C design have been proposed. To wit: John E. Leiss, et al., "dRAM Using the Taper-Isolation Dynamic Cell," *IEEE Transactions on Electron Devices,* Vol. Ed. 29, No. 4, April 1982 (pp. 707–714), describes a MOS transistor with a buried channel structure. Data storage is effected by respectively charging and discharging a surface inversion layer through a parasitic transistor that is formed at a taper portion of an element isolation film. However, the cell structure described by Leiss, et al. is relatively complicated and its operation depends on the characteristics of the parasitic transistor, which are likely to prove insufficiently controllable and repeatable in production quantities.

In another approach, data is represented as a threshold voltage of a MOS transistor, wherein the threshold voltage is determined by the well potential of individual transistors in a memory array. See Japanese Patent Laid-Open Publication No. H3-171768. The resulting structure is relatively straightforward, but requires that both the drain and the source be coupled to separate conductors so that the applied bias voltages may be independently controlled. Moreover, the cell size tends to be substantial, and programming on a bit-by-bit basis is unavailable because electrical and physical isolation must be maintained between cells.

Marnix R. Tack, et al., "The Multistable Charge-Controlled Memory Effect in SOI Transistors at Low Temperatures," *IEEE Transactions on Electron Devices,* Vol. 37, May, 1990 (pp. 1373–1382), describes a memory cell in which a MOS transistor is formed on an SOI substrate. Data storage is realized here by applying a large negative voltage from the SOI substrate side of the cell. As a result, holes are caused to accumulate in an oxide film. Alternative logic states are represented by the respective emission or injection of holes from or to the oxide layer. This approach is compromised by the necessity to apply the negative bias from the SOI substrate, again precluding the capability of programming on a bit-by-bit basis.

Hsing-jen Wann, et al., "A Capacitorless DRAM Cell on SOI Substrate," *IEDM93* (pp. 635–638), similarly proposes a memory cell in the form of a MOS transistor on an SOI substrate. In this device, a conduction layer of a conductivity type opposite to the conductivity type of the transistor is formed on the drain diffusion area of the MOS transistor. In this manner, read and write operations are performed by respective integrated nMOS (read) and pMOS (write) transistors. The substrate of the nMOS transistor is an effective floating node so that data is represented by the potential of the nMOS substrate. To its detriment, this cell configuration relies on a relatively exotic device design and demands a similarly involved interconnect scheme, including a word line, a write bit line, a read bit line, and a purge line.

United States Patent Pub. No. US200210051378, "Semiconductor Memory Device and Method of Manufacturing the Same," describes a (1T/0C) memory cell in which each cell exhibits a floating body region that is isolated from the floating body region of every other cell in the array. Specifically, the memory cell incorporates an SOI structure in which an nMOS transistor is formed in a p-type body region, over a silicon dioxide insulating film. N-type drain and diffusion regions are formed to the depth of the insulating film so that the body region is isolated at its bottom surface by the insulating layer, on its sides by the respective drain and source regions, and at its upper surface by the gate structure. Data is represented in the cell by modulating the threshold voltage of the MOS transistor. In particular, a logic level ONE is asserted through the accumulation of majority carriers (holes) in the p-type body region. The accumulation of holes is manifested as a decrease in the device threshold voltage. Production of holes is precipitated by the impact ionization mechanism. A second logic level (e.g., ZERO) results as holes are emitted from the body region upon the application of a forward bias to the PN junction on the drain side of the memory cell. Although the above-described memory cell is commendable in its simplicity of structure, it suffers from a notable inefficiency in operation. That is, the generation of majority carriers through impact ionization requires a drain current that may be orders of magnitude greater than the hole current it supports. Clearly, the wasteful dissipation of power is contraindicated in many applications. In addition, impact ionization is known to be detrimental to the MOS transistor current and transconductance characteristics.

Accordingly, existing approaches to the design and implementation of a RAM cell structure have been unavailing in satisfying multifarious requirements that include compatibility with small device geometries, simplicity of device structure and fabrication, amenability to low-power operation, and reliability.

BRIEF DESCRIPTION OF THE DRAWINGS

The subject Write Operation for Capacitorless RAM be better understood by, and its many features, advantages and capabilities made apparent to, those skilled in the art with reference to the Drawings that are briefly described immediately below and attached hereto, in the several Figures of which identical reference numerals(if any) refer to identical or similar elements and wherein.

Figure 1:
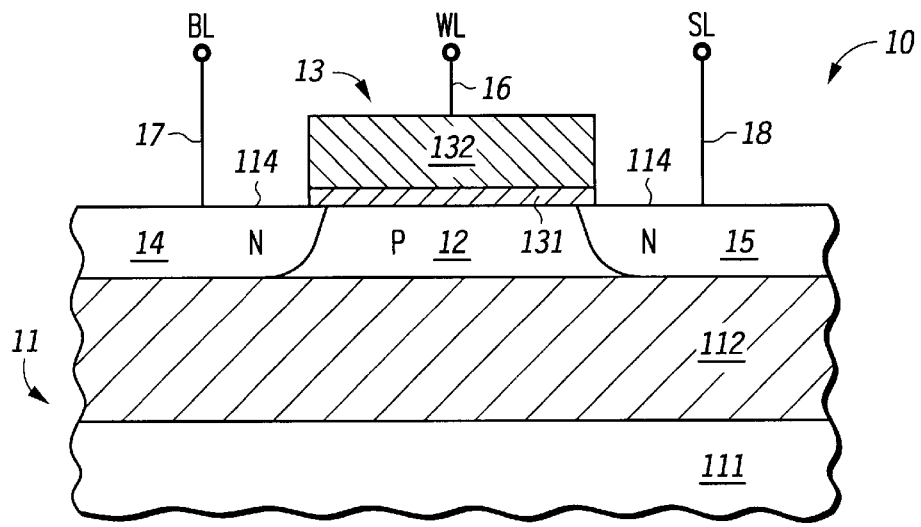
FIG. 1 is a cross-sectional view of a (1T/0C) cell, in which there may be seen an isolated body region (12) separated from a substrate (111) by an insulating layer (112). Drain (14) and source (15) regions extend from the device surface to the insulating layer (112).

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF THE PREFERRED EMBODIMENT(S)

For a thorough understanding of the subject Write Operation for a Capacitorless RAM, reference is made to the following Detailed Description, which includes the appended Claims, in conjunction with the above-described Drawings.

In a manner that will become eminently apparent below, the subject invention inheres, in one form, in a method for programming a single-transistor capacitorless (1T/0C) memory cell. Specifically, the memory cell, which comprises a floating (i.e., isolated) body region, is programmed by modulating the threshold voltage, $V_T$, of a MOS transistor that includes the body region and respective drain and source regions, formed on an insulating substrate. $V_T$ modulation is effected through the accumulation, as a result of band-to-band tunneling (BTBT), of majority carriers in the body region. Programming the memory cell in this manner is preferable to other known techniques in that, inter alia, generation of majority carriers by BTBT demands appreciably lower drain current.

FIG. 1 is a cross-sectional view of a more or less canonical implementation of a (1T/0C) memory cells such as alluded to above. As may be seen in FIG. 1, memory cell comprises an nMOS transistor 10 formed on an SOI substrate 11. Substrate 11 consists essentially of a silicon substrate 111 on which there is formed an insulating layer 112 of, for example, silicon dioxide.

SOI structures are attractive in large part because of the reduction in parasitic capacitance they afford. Several approaches are known to be available for the production of SOI wafers. In one approach, a large dose (approximately $10^{18}$ atoms/cm$^2$) of oxygen is implanted into the silicon wafer. Subsequent annealing of the implanted oxygen at high temperature forms the buried SiO$_2$ layer 112. The aforementioned process is widely known by the acronym SIMOX, for "separation by implanted oxygen." Alternatively, an SOI device may be realized by the so-called "bond and etch back" (BESOI) technique. In this process, two wafers are pressed together at high temperature until the wafers may be fused at low temperature by anodic bonding. The wafers are oxidized before bonding so that a layer of oxide remains at the interface between the two wafers. The resulting wafer can be ground back to thicknesses of 2 to 3 $\mu$m, or less, using standard grinding and polishing techniques.

Subsequently, widely understood fabrication techniques are used to form an nMOS transistor on insulating layer 112. The resulting device comprises a body region 12 of p-type conductivity. An n-type drain region 14 is formed at one end of body region 12, and n-type source region 15 is formed at the opposite end of body region 12. Note that the drain and source regions are each formed to extend between surface 114 and insulating layer 112 of substrate 11. A gate structure 13, including a gate conductor 132 and a gate dielectric 131, is disposed on surface 114 overlying body region 12. In a preferred embodiment, nMOS transistor 10 is fabricated so that drain region 14 and source region 15 are self-aligned with gate 13. Finally, an interconnect system is provided that includes a word line (WL) 16 connected to gate 13, a bit line (BL) 17 connected to drain 14, and a source line (SL) 18 connected to source 15.

Device designers appreciate that the nature of the vertical electric field that is established in the body of the memory cell is a principal determinant of operation in the BTBT mode. The magnitude of the vertical electric field is, in turn, controllable by the gate oxide thickness. The dopant concentration in the body of the device is an additional significant variable in establishing the vertical electric field. In addition, the PN junctions of the device are advisably abrupt so that the requisite lateral electric field is established in the body of the device. Therefore, source region 15 and drain region 14 are to be doped more heavily than body region 12. Therefore, the design of a BTBT memory cell may be viewed as a cross-correlated calculus of a number of parameters, the objective of which is to obtain the requisite relationship between the vertical and lateral electric fields that are established in the body of the device. To this end, in one embodiment, a gate oxide thickness of 30 angstroms, body dopant concentration of approximately $10^{17}$ atoms/cm$^3$ and source and drain dopant concentrations of approximately $4\times10^{20}$ atoms/cm$^3$ were determined to be effective.

Figure 2:
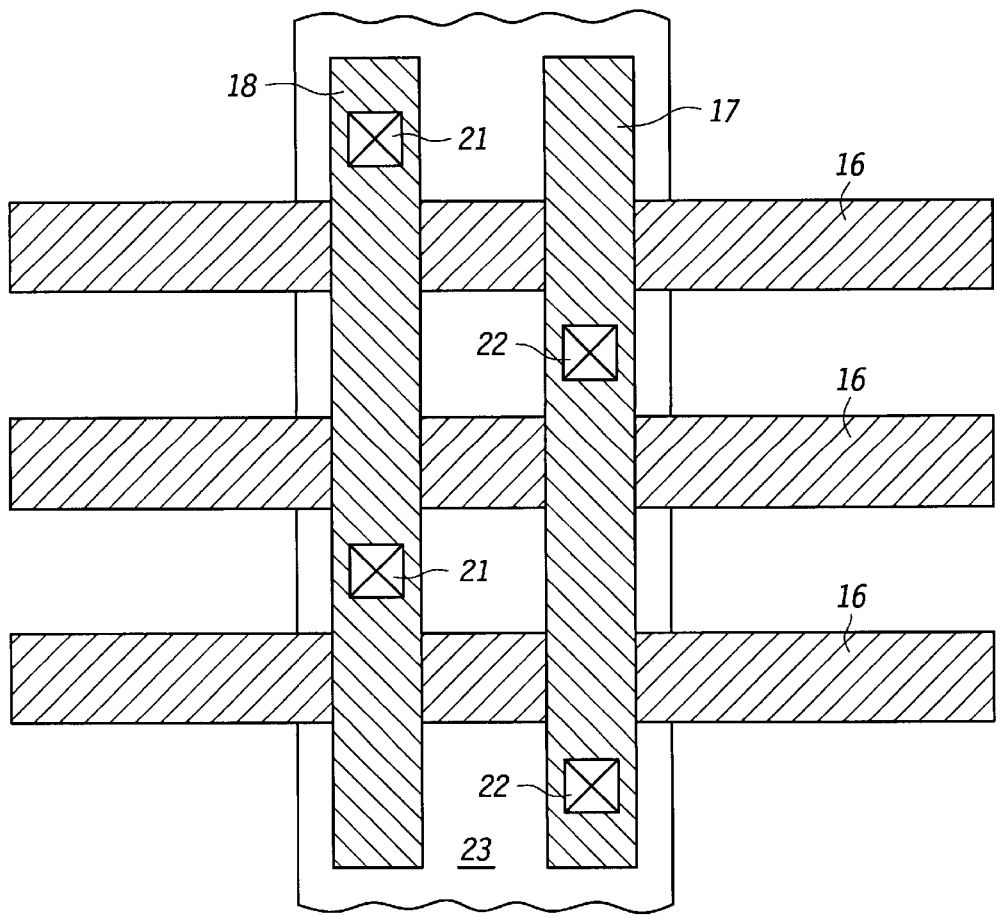
FIG. 2 illustrates a mask layout applicable to a RAM cell in accordance with the invention.

FIG. 2 is a graphical representation of an operative mask layout for a semiconductor device in which there is fabricated a memory array that includes a number of memory cells 10. As illustrated in FIG. 2, a plurality of wordlines (WLs)16 extend in a horizontal direction, substantially parallel to the surface of the device. Each WL 16 also constitutes the polysilicon gate conductor 132 of respective memory cells in a given row of a memory array. BL17 and SL18 extend over WLs 16 in a vertical direction. SL18 is electrically connected to the source region 15 of each memory cell 10 in the array through a respective one of a requisite number of conductive vias 21. Similarly, BL17 is electrically connected to the drain region 14 of each memory cell 10 in the array through a requisite number of conductive vias 22. The active areas of memory cells 10 are formed in active area 23 illustrated in FIG. 2.

Those experienced in the art of semiconductor memory design and fabrication appreciate that the RAM cell structure described immediately above requires an additional conductive element beyond that which is customarily provided. That is, conventional memory array architecture is satisfied by the inclusion of a single source line, for example. However, the requirement for an additional conductive trace is not deemed a significant detriment here. This is because the relatively low current produced by memory cell 10 requires a device width that is somewhat greater than would otherwise be indicated. That is, because the current differential between a memory cell at logic ONE and a memory cell at logic ZERO tends to be small, the memory cells are designed to have greater than minimal width in order to enhance the current differential in a manner that comfortably drives downstream sense amplifiers. For example, doubling the device width may increase the on/off current differential from 5 $\mu$ amp to 10 $\mu$ amps, thereby relaxing the design performance requirements associated with the sense amplifiers. Consequently, an additional conductor in the vertical direction is accommodated with facility by the relatively larger device width.

In addition, the additional conductor is advantageous in the respect that it may be used to minimize leakage current that might arise on unselected WLs. Specifically, in the absence of SL18, the sources of all cells are commonly connected by a metallic strap conductor that is in turn connected to a single reference voltage. Because the leakage current of unselected SOI memory cells can approach nanoamps/device, and because a given column in the memory array may include several hundred memory cells (256 or 512, for example), then the aggregate worst-case leakage current may become comparable to the typical read current. As a countermeasure, a source bias may be applied to unselected cells in order to achieve hard turn-off. This is more readily accomplished when the turn-off bias is available for application on a column-by-column basis, rather than only globally on the entire array.

Figure 3:
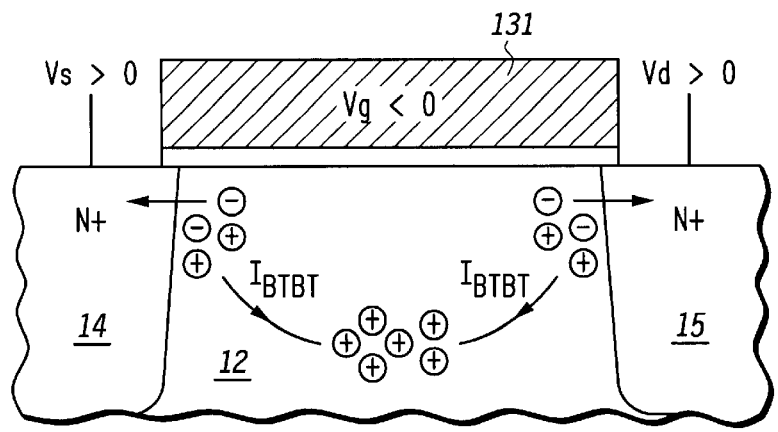
FIG. 3 is a graphical representation of the manner in which BTBT may be exploited to write data in a RAM cell that has an isolated body region.

FIG. 3 graphically illustrates the physical principles that enable data to be written to the RAM cell depicted in FIG. 1 by a BTBT mechanism. Given a p-type body region 12, and highly doped N+ drain and source regions 14 and 15, respectively, positive voltages, $V_S$ and $V_D$, are applied to the drain and to the source. In one embodiment, $V_D$ and $V_S$ may be substantially equal. A negative bias is applied to the gate conductor 131. These bias conditions stimulate the generation of hole/electron pairs by BTBT. Electrons are swept out of body region 12 to both source 14 and drain 15. As a result, a net concentration of holes accumulates in body region 12, thereby decreasing the effective threshold voltage, $V_T$, of the body region.

In practical application, the RAM cell described above and depicted in FIG. 1 will be replicated numerous instances to form a RAM array. A portion of such an array 40 is illustrated as the circuit diagram of FIG. 4.

Figure 4:
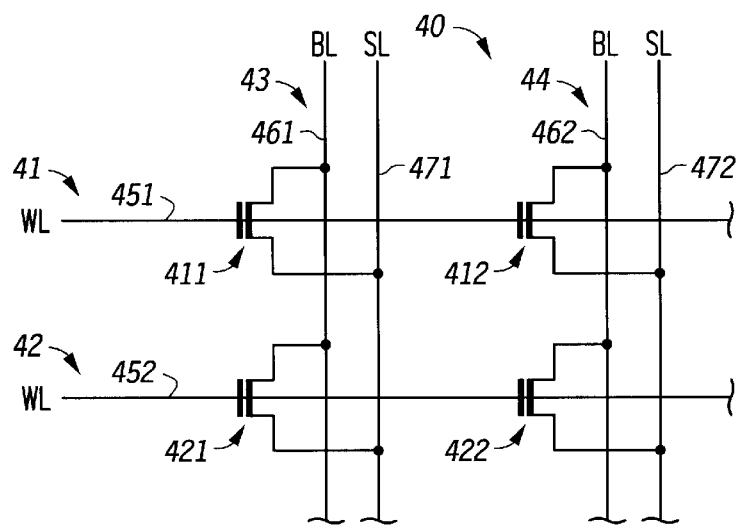
FIG. 4 is a circuit diagram of a RAM array that incorporates RAM cells that are programmed in accordance with the subject invention.

Referring now to FIG. 4, those skilled in the art will recognize memory array 40 to include a plurality of rows 41, 42 . . . and a plurality of columns 43, 44 . . . For purposes of explication, the array may be arbitrarily assumed to be populated with 8-bit words and to have a sector size of 64K (65, 536) words. A memory array so dimensioned will therefore be populated by 512K cells. For the limited purposes of this Description, it may be conveniently assumed that the cells are, to the extent permitted by operative device fabrication processes, substantially identical in form and performance. For simplicity, only the first two rows, 41 and 42, and the first two columns, 43 and 44, of memory array 40 are shown in FIG. 4. Likewise, only four RAM cells, 411, 412, 421, and 422, respectively, are shown.

With continued reference to FIG. 4, it is seen that array 40 includes a first word line 451 that is sequentially coupled to the gate conductors of cell 411 and cell 412, as well as to the gate conductors of the remaining cells (not shown) that constitute row 41. A second word line 452 is likewise sequentially coupled to the gate conductors of cell 421 and of cell 422, as well as to the gate conductors of the remaining cells (not shown) that constitute row 42. A first bit line 461 is sequentially coupled to the drain of cell 411 and to the drain of cell 421, as well as to the respective drains of the remaining cells (not shown) that constitute column 43. A second bit line 462 is likewise sequentially coupled to the drain of cell 412 and to the drain of cell 422, as well as to the drains of the remaining cells (not shown) that constitute column 44. A first source line 471 is sequentially coupled to the source of cell 411 and to the source of cell 421, as well as to the respective sources of the remaining cells (not shown) that constitute column 43. A second source line 472 is likewise sequentially coupled to the source of cell 412 and to the source of cell 422, as well as to the respective sources of the remaining cells (not shown) that constitute column 44. Similarly, those having such familiarity understand that the arrangement of cells illustrated in FIG. 4 is simply extrapolated to form the remaining rows of memory array 40 and that a corresponding source line is provided for each of the remaining row pairs. Schemes for addressing the contents of memory array 40 are deemed largely collateral to the invention and are, accordingly, not treated here. However, certain details regarding methods of programming, erasing, and reading the contents of memory array 40 are relevant, and are discussed below.

Figure 5:
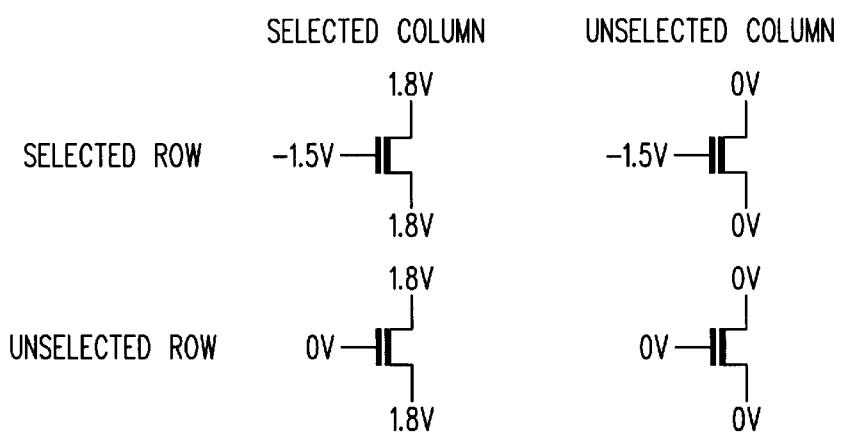
FIG. 5 depicts a biasing approach that is effective for BTBT programming of a RAM cell when both positive and negative voltage sources are available.
Figure 6:
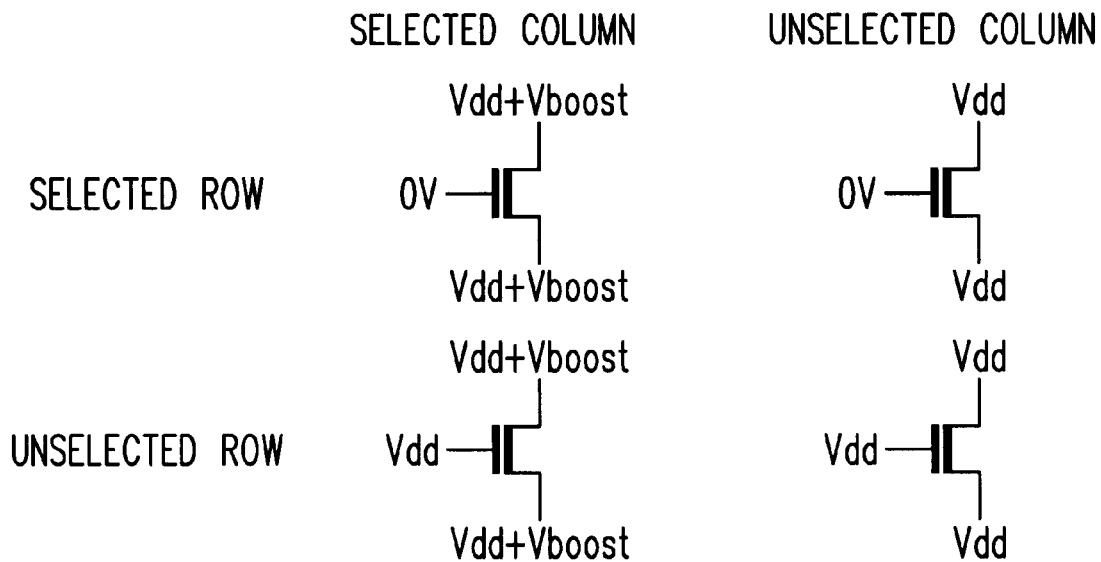
FIG. 6 depicts a biasing approach that may be utilized in instances when a negative voltage source is not practicably accessible.
Figure 7:
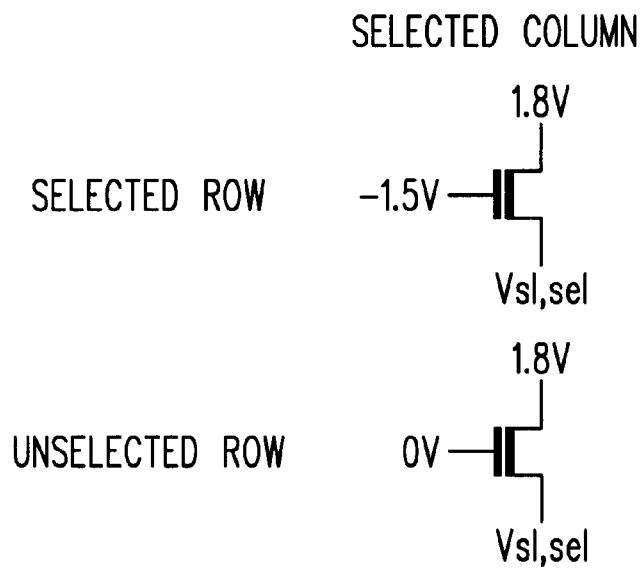
FIG. 7 depicts a biasing approach that is distinguishable by the use of a variable source line bias that is applied to selected columns, the objective being to mitigate damage delivered to the source region of the cell as a result of BTBT.

Consider now FIGS. 5, 6 and 7, which respectively illustrate alternative biasing techniques that may be used to write a desired logic level (ONE, for example) to a RAM cell in accordance with the subject invention. It is not to be inferred, however, that the techniques disclosed in those FIGs. are exhaustive or exclusive. The invention comprehends all biasing schemes that stimulate BTBT so that carriers accumulate in the body region of a memory cell in a manner that modulates the $V_T$ of the cell.

FIG. 5 depicts an approach that is effective when both positive and negative voltage supplies are available. In this approach a positive voltage of 1.8V, for example, is applied to the BL and to the SL of cells in a selected column. A negative voltage of −1.5V is applied to the WL of a selected row. A voltage of 0V, or GND, is applied to the WL, the SL and the BL of unselected cells.

FIG. 6 depicts an approach that may be utilized in those instances when a negative supply voltage is not practically available. In this situation, the drain supply voltage, Vdd, is boosted so that two positive voltages Vdd and (Vdd+Vboost) are available for writing data to the RAM cell. As may be seen in FIG. 6, (Vdd+Vboost) is applied to the BL and the SL of a selected column. A voltage of 0V, or GND, is applied to the WL of a selected row. The drain supply voltage, Vdd, is applied to the BL, and the SL of unselected column, as well as the WL of unselected rows. That is, Vdd, is applied to the SL, BL and WL of unselected cells.

FIG. 7 depicts an approach in which the voltage applied to the BL of a selected column is different from the voltage, Vsl, sel, that is applied to the SL of that column. By using a variable Vsl, sel that is not constrained to be substantially identical to the voltage that is applied to the BL of that column, it is possible to minimize damage caused by BTBT on the source side of the RAM cell. That is, BTBT results in the generation of holes in the body of the memory cell. Because some of the holes appear near the surface 114, the prevailing electric field in the body of the device, tends to cause some holes to penetrate the oxide layer at the surface, causing damage to the oxide. Oxide damage may be manifested as degradation in device gain and an unpredicted shift in threshold voltage. It is also likely that the read current of the memory cell would be adversely affected as a result of deterioration in the device transconductance.

In addition, if Vsl, sel is made at least slightly positive, then leakage of cells from unselected rows along the selected column is also minimized. In other words, given a memory cell design in which unselected rows are biased to 0V, then a Vsl, sel that is positive will discourage leakage current contributed by unselected cells in a selected column, when compared to a design in which the gate and source voltages of unselected cells are both at 0V. As a practical matter, the value of Vsl, sel is, in one embodiment, a voltage that is at once less than the BL voltage but that is also easily generated. These criteria suggest, for example, a voltage that is offset from the BL voltage by an amount grossly equal to a nominal $V_T$. In one embodiment, 1.2V might serve well as an illustrative value for Vsl,sel. As may be seen in FIG. 7, consonant with this approach, a voltage of 1.8V is applied to the BL of a selected column; and a variable voltage, Vsl, sel, is applied to the SL of that column. A negative voltage of −1.5V is applied to selected rows, while 0V is applied to unselected rows.

Accordingly, from the Description above, it should be apparent that the subject Write Operation for a Capacitorless RAM is auspicious in respect of the many features, advantages and capabilities it enables. In particular, the subject invention at once affords a simple and compact cell design, while supporting highly efficient, low-power operation, particularly when compared to cell designs reliant on hot-carrier injection (HCI). Specifically, with respect to a memory cell predicated on HCI, device conduction takes place in a normal transistor mode. Consequently, with the device operating in saturation, electrons flowing from source to drain traverse a high electric field. In so doing, the electrons are accelerated and acquire sufficient energy to cause impact ionization that generates electron/hole pairs. With the drain at a high bias, electrons are swept out the drain. Holes remain in the body. However, as a statistical matter, for each hole that is collected in the body, perhaps $10^3$ electrons must be swept out the drain. With BTBT, conversely, the electric field that is imposed between the body and the source and drain, together with the gate bias, establishes an electric field that of sufficient strength to stimulate the generation of electron/hole pairs through tunneling. That is, each electron that tunnels from the valence band to the conduction band leaves behind a corresponding hole. Because of the nature of the electric field, holes remain in the body and electrons exit the drain. Therefore, BTBT achieves essentially unity efficiency, whereas under conditions that are nondestructive to the device, HCI is capable of only fractional efficiency.

In the Description above, the invention has been set forth in the context of specific numerous embodiments, in a manner that is intended to be illustrative and to convey a thorough comprehension of the invention. However, one of ordinary skill in the art pertaining to the design and fabrication of semiconductor nonvolatile memory devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and thicknesses identified herein. Similarly, those skilled in the art understand that conductivity types (P-type, N-type) and carrier types (holes, electrons) may, in general, be reversed, provided that requisite consistency is preserved. Accordingly, the Description and the Figures are properly construed are illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

We claim:

1. A method for writing data to a (1T/0C) memory cell that comprises:
    (i) a semiconductor substrate;
    (ii) an insulating layer formed on the substrate;
    (iii) a body of semiconductor material of a first conductivity type formed on the insulating material and having an upper surface;
    (iv) a drain region of a second conductivity type formed at a first end of the body of semiconductor material, the drain region extending vertically between the upper surface and the insulating layer;
    (v) a source region of the second conductivity type formed at a second end of the body of semiconductor material, the source region extending vertically between the upper surface and the insulating layer;
    (vi) a gate dielectric formed on the upper surface;
    (vii) a gate conductor formed over the gate dielectric; and
    (viii) a word line (WL) coupled to the gate conductor, a bit line (BL) coupled to the drain region, and a source line (SL) coupled to the source region, the method comprising:
        applying a first voltage to the WL;
        applying a second voltage to the BL;
        applying a third voltage to the SL;
        causing electron/hole carrier pairs to appear in the body as a result of a BTBT mechanism;
        causing carriers of the second conductivity type to flow from the body to the drain and to the source regions; and
        causing carriers of the first conductivity type to accumulate in the body so as to modulate the threshold voltage of the memory cell.

2. A method of writing data to a (1T/0C) memory cell as defined in claim 1, wherein the body of semiconductor material is of p-type conductivity, the second voltage is substantially equal to the third voltage, the first voltage is less than the second voltage and less than the third voltage, and holes are caused to accumulate in the body so as to decrease the threshold voltage of the memory cell.

3. A method of writing data to a (1T/0C) memory cell as defined in claim 2, wherein the first voltage is negative, the second voltage is positive, and the third voltage is positive.

4. A method of writing data to a (1T/0C) memory cell as defined in claim 2, wherein the first voltage is at GND, the second voltage is positive, and the third voltage is at positive.

5. A method of writing data to a (1T/0C) memory cell as defined in claim 4, wherein the second voltage and the third voltage are boosted from the drain supply voltage.

6. A method of writing data to a (1T/0C) memory cell as defined in claim 1, wherein:
(a) the body of semiconductor material is of p-type conductivity;
(b) the second and the third voltages are greater than the first voltage so that holes are caused to accumulate in the body so as to decrease the threshold voltage of the memory cell; and
(c) the second voltage is different in magnitude from the third voltage so as to mitigate damage from BTBT at the source region.

7. A (1T/0C) memory cell comprising:
a semiconductor substrate;
an insulating layer formed on the substrate;
a body region of semiconductor material of a first conductivity type, the body region formed on the insulating layer and having an upper surface;
a drain region of a second conductivity type formed at a first end of the body region, the drain region extending vertically between the upper surface and the insulating layer;
a source region of the second conductivity type formed at a second end of the body region, the source region extending vertically between the upper surface and the insulating layer;
a gate dielectric formed on the upper surface;
a gate conductor formed on the gate dielectric;
a word line (WL) coupled to the gate conductor;
a bit line (BL) coupled to the drain region;
a source line (SL) coupled to the source region;
a first voltage applied to the WL;
a second voltage applied to the BL;
a third voltage applied to the SL; and
an accumulation of carriers of the first conductivity type in the body region, the accumulation resulting from the generation of electron/hole carrier pairs by a BTBT mechanism and the flow of carriers of the second conductivity type from the body region to the drain and source regions.

8. A method of writing data to a (1T/0C) memory cell as defined in claim 7, wherein the body of semiconductor material is a p-type conductivity, the second voltage is substantially equal to the third voltage, the first voltage is less than the second voltage and less than the third voltage, and holes are caused to accumulate in the body so as to decrease the threshold voltage of the memory cell.

9. A method of writing data to a (1T/0C) memory cell as defined in claim 8, wherein the first voltage is negative, the second voltage is positive, and the third voltage is positive.

10. A method of writing data to a (1T/0C) memory cell as defined in claim 8, wherein the first voltage is at GND, the second voltage is positive, and the third voltage is positive.

11. A method of writing data to a (1T/0C) memory cell as defined in claim 10, wherein the second voltage and the third voltage are boosted from the drain supply voltage.

12. A method of writing data to a (1T/0C) memory cell as defined in claim 11, wherein:
(a) the body of semiconductor material is of p-type conductivity;
(b) the second and the third voltages are greater than the first voltage so that holes are caused to accumulate in the body so as to decrease the threshold voltage of the memory cell; and
(c) the second voltage is different in magnitude from the third voltage so as to mitigate damage from BTBT at the source region.

13. An array of (1T/0C) memory cells arranged in a plurality of columns and a plurality of rows, each memory cell comprising:
a semiconductor substrate;
an insulating layer formed on the substrate;
a body region of semiconductor material of a first conductivity type, the body region formed on the insulating layer and having an upper surface;
a drain region of a second conductivity type formed at a first end of the body region, the drain region extending vertically between the upper surface and the insulating layer;
a source region of the second conductivity type formed at a second end of the body region, the source region extending vertically between the upper surface and the insulating layer;
a gate dielectric formed on the upper surface;
a gate conductor formed on the gate dielectric;
a first word line (WL) coupled to the gate conductor of each cell in a first row;
a second WL coupled to the gate conductor of each cell in a second row;
a first bit line (BL) coupled to the drain region of each cell in a first column;
a second BL coupled to the drain region of each cell in a second column;
a first source line (SL) coupled to the source region of each cell in the first column;
a second SL coupled to the source region of each cell in the second column;
a first voltage applied to the first WL;
a second voltage applied to the first BL;
a third voltage applied to the first SL; and
a first cell having a gate conductor coupled to the first WL, a drain region coupled to the first BL and a source region coupled to the first SL and having an accumulation of carriers of the first conductivity type in the body region, the accumulation resulting from generation of electron/hole carrier pairs by a BTBT mechanism and carriers of the second conductivity type flowing from the body region to the drain region and the source region.

14. An array of (1T/0C) memory cells as defined in claim 13, further comprising;
a fourth voltage applied to the second WL, to the second BL, and to the second SL.

15. An array of (1T/0C) memory cells as defined in claim 14, wherein the body region is of p-conductivity type, the second voltage is substantially equal to the third voltage, the first voltage is less than the second voltage and less than the third voltage, and holes are caused to accumulate is in the body region of the first cell so as to decrease the threshold voltage of the first cell.

16. An array of (1T/0C) memory cells as defined in claim 15, wherein the first voltage is negative and the second and the third voltages are positive.

17. An array of (1T/0C) memory cells as defined in claim 14, wherein the first voltage is at GND, second voltage is positive, and the third voltage is positive.

18. An array of (1T/0C) memory cells as defined in claim 17, wherein the second voltage and the third voltage are boosted from the drain supply voltage.

19. An array of (1T/0C) memory cells as defined in claim 18, wherein the fourth voltage is the drain supply voltage.

20. An array of (1T/0C) memory cells as defined in claim 13, wherein:
    (a) the body region of the first cell is of p-type conductivity;
    (b) the second and the third voltages are greater than the first voltage so that holes are caused to accumulate in the body region of the first cell; and
    (c) the second voltage is different in magnitude from the third voltage so as to mitigate damage from BTBT at the source region of the first cell.

21. An array of (1T/0C) memory cells as defined in claim 13, wherein:
    the first WL corresponds to a selected row;
    the second WL corresponds to an unselected row;
    the first BL corresponds to a selected column;
    the second BL corresponds to an unselected column;
    the first SL corresponds to a selected column; and
    the second SL corresponds to an unselected column.

22. An array of (1T/0C) memory cells as defined in claim 21, further comprising:
    a fourth voltage applied to the second WL, to the second BL, and to the second SL.

23. An array of (1T/0C) memory cells as defined in claim 22, wherein:
    the body region is of p-type conductivity;
    the first voltage is less than the second voltage and less than the third voltage;
    the second voltage is substantially equal to the third voltage; and
    the fourth voltage is greater than the first voltage and is less than the second voltage and less than the third voltage.

24. An array of (1T/0C) memory cells as defined in claim 23, wherein the body region is of p-conductivity type, the second voltage is substantially equal to the third voltage, the first voltage is less than the second voltage and less than the third voltage, and holes are cause to accumulation is in the body region of the first cell so as to decrease the threshold voltage of the first cell.

25. An array of (1T/0C) memory cells as defined in claim 24, wherein the first voltage is negative and the second and the third voltages are positive.

26. An array of (1T/0C) memory cells as defined in claim 23, wherein the first voltage is at GND, second voltage is positive, and the third voltage is positive.

27. An array of (1T/0C) memory cells as defined in claim 26, wherein the second voltage and the third voltage are boosted from the drain supply voltage.

28. An array of (1T/0C) memory cells as defined in claim 27, wherein the fourth voltage is the drain supply voltage.

29. An array of (1T/0C) memory cells as defined in claim 22, wherein:
    (a) the body region of the first cell is of p-type conductivity;
    (b) the second and the third voltages are greater than the first voltage so that holes are caused to accumulate in the body region of the first cell; and
    c) the second voltage is different in magnitude from the third voltage so as to mitigate damage from BTBT at the source region of the first cell.

30. A memory cell comprising:
    an insulating layer;
    a body region disposed on the insulating layers, the body region having first-type conductivity;
    a second region disposed on the insulating layer at a first end of the body region, the second region having second-type conductivity;
    a first PN junction formed by the body region and the second region;
    a third region disposed on the insulating layer at a second end of the body region, the third region having second-type conductivity;
    a second PN junction formed by the body region and the third region;
    a gate structure formed on an upper surface of the body region; and
    a net concentration of carriers of the first-type conductivity in the body region, the net concentration resulting from BTBT and the flow of carriers of the second-type conductivity through the first PN junction and through the second PN junction.

* * * * *

UNITED STATES PATENT AND TRADEMARK OFFICE
CERTIFICATE OF CORRECTION

PATENT NO.    : 6,714,436 B1
DATED         : March 30, 2004
INVENTOR(S)   : James D. Burnett et al.

It is certified that error appears in the above-identified patent and that said Letters Patent is hereby corrected as shown below:

Column 10,
Line 5, delete "accumulate is in" and replace with -- accumulate in --.

Column 11,
Line 5, delete "accumulation" and replace with -- accumulate in --.

Signed and Sealed this

Twenty-sixth Day of July, 2005

JON W. DUDAS
*Director of the United States Patent and Trademark Office*